US012813265B2

(12) United States Patent
Lee

(10) Patent No.: US 12,813,265 B2
(45) Date of Patent: Nov. 24, 2026

(54) POWER MODULE HAVING BRAZING BONDING LAYER BETWEEN SUBSTRATE AND SPACER AND METHOD FOR MANUFACTURING SAME

(71) Applicant: AMOGREENTECH CO., LTD., Gimpo-si (KR)

(72) Inventor: Jihyung Lee, Gimpo-si (KR)

(73) Assignee: AMOGREENTECH CO., LTD., Gimpo-si (KR)

( * ) Notice: Subject to any disclaimer, the term of this patent is extended or adjusted under 35 U.S.C. 154(b) by 292 days.

(21) Appl. No.: 17/799,668

(22) PCT Filed: Feb. 8, 2021

(86) PCT No.: PCT/KR2021/001600

§ 371 (c)(1),
(2) Date: Aug. 13, 2022

(87) PCT Pub. No.: WO2021/162369

PCT Pub. Date: Aug. 19, 2021

(65) Prior Publication Data

US 2023/0075200 A1 Mar. 9, 2023

(30) Foreign Application Priority Data

Feb. 13, 2020 (KR) ........................ 10-2020-0017331

(51) Int. Cl.
*H10W 40/25* (2026.01)
*H10W 40/77* (2026.01)
(Continued)

(52) U.S. Cl.
CPC ......... *H10W 40/255* (2026.01); *H10W 40/77* (2026.01); *H10W 70/02* (2026.01); *H10W 99/00* (2026.01)

(58) Field of Classification Search
CPC ........... H01L 21/4807; H01L 21/4871; H10W 40/255; H10W 70/02; H10W 40/77; H10W 99/00
See application file for complete search history.

(56) References Cited

U.S. PATENT DOCUMENTS 10,147,665 B2 12/2018 Park et al.
10,622,276 B2 4/2020 Kim
(Continued)

FOREIGN PATENT DOCUMENTS

CN 103531704 A * 1/2014
CN 106847781 A 6/2017
(Continued)

OTHER PUBLICATIONS

KR Office Action dated Apr. 6, 2023 as received in Application No. 10-2021-0017298.
(Continued)

*Primary Examiner* — Norman D Richards
*Assistant Examiner* — Sean Ayers Winters
(74) *Attorney, Agent, or Firm* — Maschoff Brennan

(57) ABSTRACT

The present invention relates to a power module and a method for manufacturing same, in which an insulating spacer is disposed between two upper and lower substrates to thus efficiently dissipate the heat generated from a semiconductor chip mounted between the substrates, and prevent bending deformation due to heat. In addition, since the spacer made of an insulating material is integrated with the substrates by brazing bonding, the bonding strength is improved, thereby maintaining strong bonding even against vibration, etc.

6 Claims, 4 Drawing Sheets

(51) Int. Cl.
*H10W 70/02* (2026.01)
*H10W 99/00* (2026.01)

(56) References Cited

U.S. PATENT DOCUMENTS

| | | | | |
|---|---|---|---|---|
| 2008/0054425 | A1* | 3/2008 | Malhan | H01L 24/01 257/E25.016 |
| 2008/0305582 | A1* | 12/2008 | Fillion | H01L 23/5385 438/118 |
| 2009/0218666 | A1 | 9/2009 | Yang | |
| 2012/0261809 | A1* | 10/2012 | Yen | H01L 24/29 257/684 |
| 2012/0267149 | A1* | 10/2012 | Oi | H01L 21/4857 29/846 |
| 2016/0126157 | A1* | 5/2016 | Jeon | H01L 23/051 257/693 |
| 2016/0307817 | A1* | 10/2016 | Kimura | H01L 23/049 |
| 2017/0162468 | A1 | 6/2017 | Ko | |
| 2017/0287875 | A1* | 10/2017 | Gao | H01L 21/486 |
| 2018/0090414 | A1 | 3/2018 | Dan et al. | |
| 2018/0102301 | A1* | 4/2018 | Jeon | H01L 25/50 |
| 2019/0384432 | A1* | 12/2019 | Perlin | G06F 3/047 |
| 2020/0163210 | A1* | 5/2020 | Yuasa | H05K 1/0306 |
| 2021/0050278 | A1 | 2/2021 | Kitahara et al. | |

FOREIGN PATENT DOCUMENTS

| | | | | |
|---|---|---|---|---|
| CN | 108231709 | A | 6/2018 | |
| KR | 10-0147961 | B1 | 8/1998 | |
| KR | 10-2009-0093163 | A | 9/2009 | |
| KR | 10-2015-0121647 | A | 10/2015 | |
| KR | 10-2016-0126923 | A | 11/2016 | |
| KR | 10-2017-0008696 | A | 1/2017 | |
| KR | 10-1734712 | B1 | 5/2017 | |
| KR | 10-2017-0066852 | A | 6/2017 | |
| KR | 10-2017-0068271 | A | 6/2017 | |
| KR | 20180030298 | A * | 3/2018 | H01L 23/3731 |
| KR | 10-2018-0038597 | A | 4/2018 | |
| TW | 201933552 | A | 8/2019 | |
| WO | 2019/022133 | A1 | 6/2020 | |

OTHER PUBLICATIONS

KR Office Action dated Oct. 27, 2022 as received in Application No. 10-2021-0017298.

CN Office Action dated May 25, 2025 as received in Application No. 202180014642.5.

* cited by examiner

[FIG. 1]
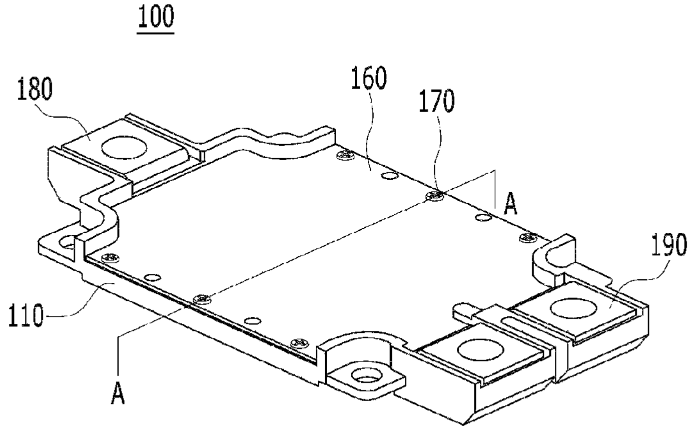
[FIG. 2]
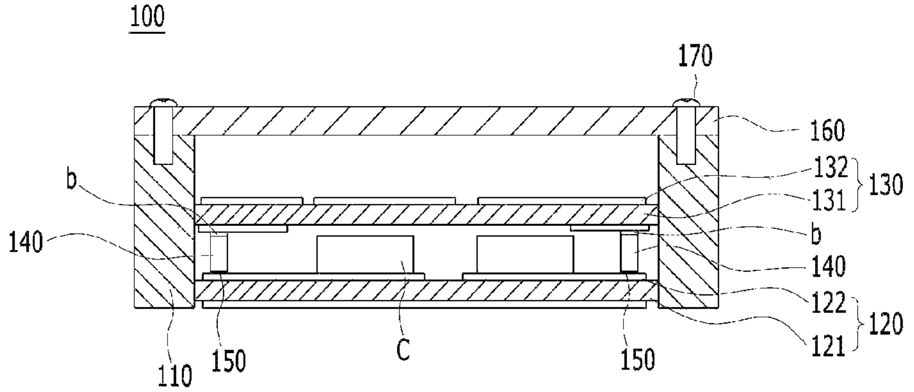

[FIG. 3]
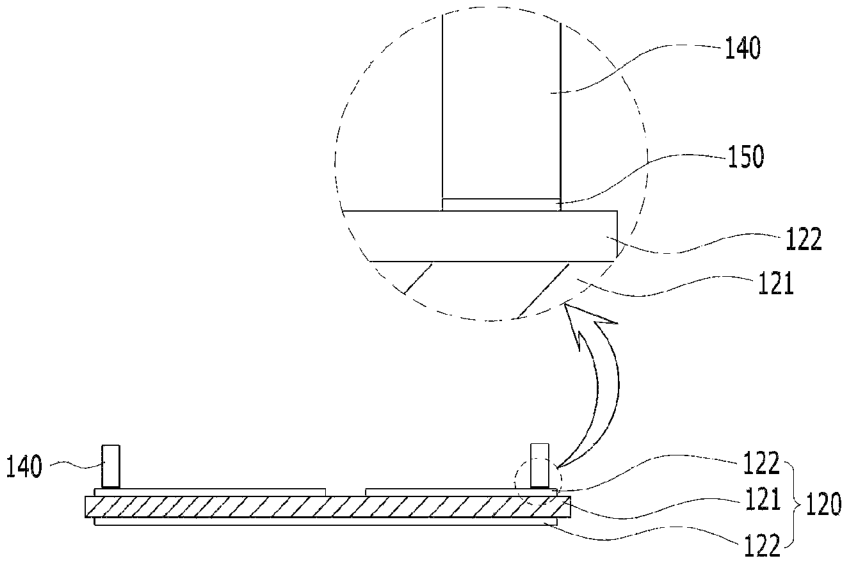
[FIG. 4]
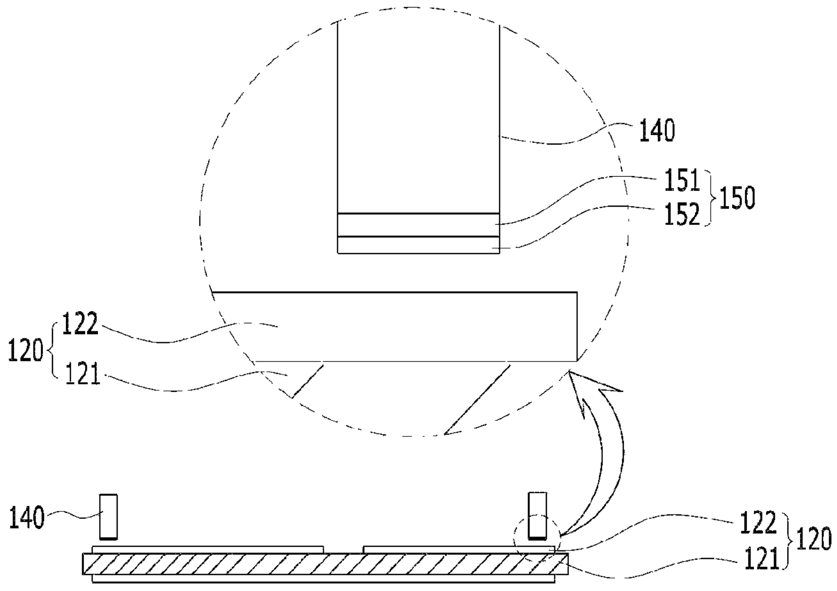

[FIG. 5]
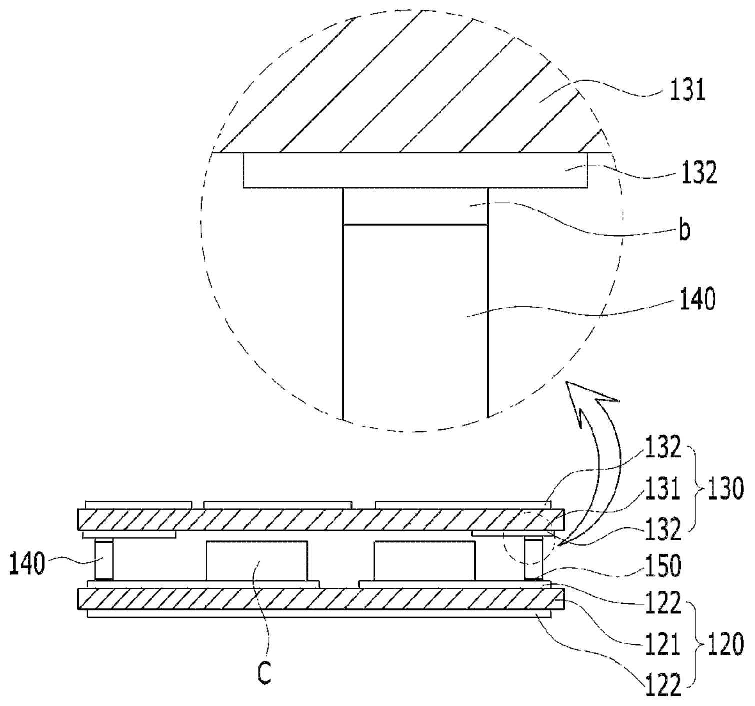

[FIG. 6]
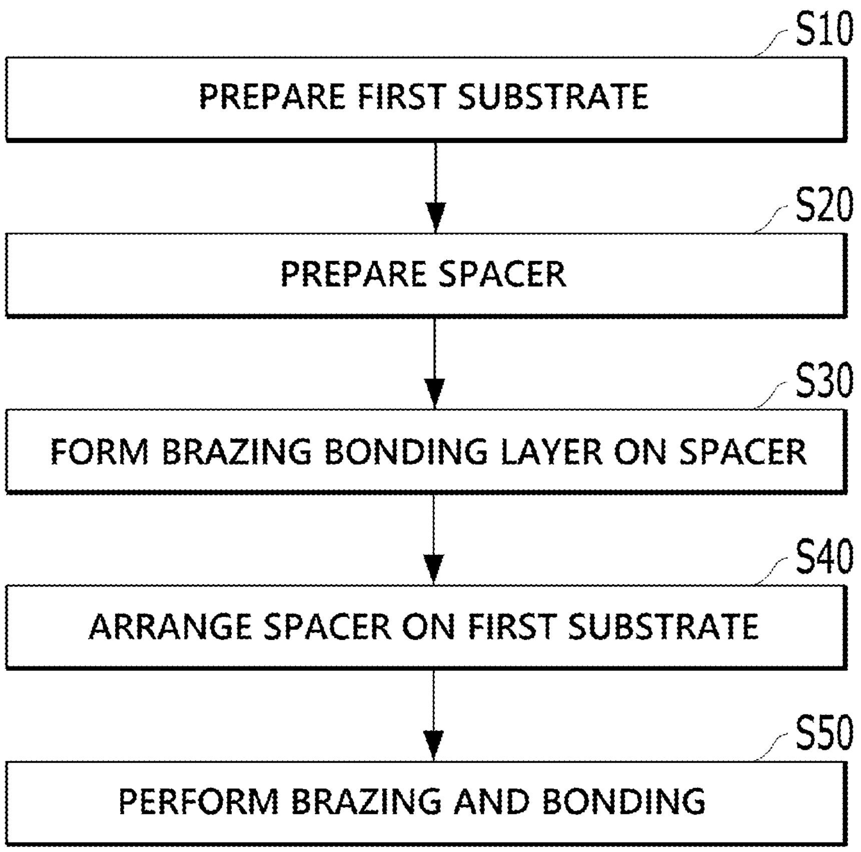

POWER MODULE HAVING BRAZING BONDING LAYER BETWEEN SUBSTRATE AND SPACER AND METHOD FOR MANUFACTURING SAME

TECHNICAL FIELD

The present disclosure relates to a power module having a structure in which a semiconductor chip is mounted between two upper and lower substrates, and a method for manufacturing the same.

BACKGROUND ART

Power modules are used to supply a high voltage current to drive motors of hybrid vehicles and electric vehicles.

Among the power modules, a double-sided cooling power module has substrates on upper and lower portions of a semiconductor chip, and a heat dissipation plate on an outer surface of each substrate. The double-sided cooling power module has excellent cooling performance compared to a single-sided cooling power module having a heat dissipation plate on one surface so that the use of the double-sided cooling power module is gradually increasing.

The double-sided cooling power module used in electric vehicles and the like has a power semiconductor chip including silicon carbide (SiC) and gallium nitride (GaN) mounted between two substrates, and high heat generation and vibration during driving occur due to a high voltage, and thus in order to solve the above problems, it is important to satisfy both high strength and high heat dissipation characteristics.

SUMMARY OF INVENTION

Technical Problem

The present disclosure has been made in efforts to solve the above problem, and an object of the present disclosure is to provide a single-sided cooling power module or a double-sided cooling power module having high strength and high heat dissipation characteristics, an excellent bonding characteristic, and capable of improving performance, and a manufacturing method thereof.

Solution to Problem

In order to achieve the object, according to features of the present disclosure, the power module includes a first substrate having an upper surface on which at least one semiconductor chip is mounted, a second substrate disposed above the first substrate, a spacer bonded to the upper surface of the first substrate and configured to define a separation distance between the first substrate and the second substrate, and a brazing bonding layer configured to bond the spacer to the first substrate.

The first substrate may include a ceramic substrate and a metal layer brazed and bonded to at least one surface of the ceramic substrate.

The metal layer may be Cu.

The spacer may be a ceramic material.

The spacer may be formed of one selected from $Al_2O_3$, ZTA, $Si_3N_4$, and AlN or a mixture of two or more thereof.

A height of the spacer may be relatively greater than that of the semiconductor chip.

The brazing bonding layer may include AgCu.

The brazing bonding layer may further include Ti.

The power module may further include a bonding layer configured to bond the spacer to the second substrate, and the bonding layer may be made of solder or an Ag paste.

A method of manufacturing a power module may include preparing a first substrate, preparing a spacer, forming a brazing bonding layer on the first substrate or the spacer, arranging the spacer on the first substrate to interpose the brazing bonding layer between the first substrate and the spacer, and performing heat treatment on the brazing bonding layer and brazing and bonding the spacer to the first substrate.

In the preparing of the first substrate, a ceramic substrate in which a metal layer is bonded to at least one surface of a ceramic substrate may be prepared.

In the preparing of the spacer, the spacer formed of one selected from $Al_2O_3$, ZTA, $Si_3N_4$, and AlN or a mixture of two or more thereof may be prepared.

The forming of the brazing bonding layer may further include forming an AgCu layer on the first substrate or the spacer by any one among paste printing, foil attachment, and filler attachment.

The forming of the brazing bonding layer may further include forming a Ti layer before or after the forming of the AgCu layer.

In the arranging of the spacer on the first substrate, a plurality of spacers may be disposed around an edge of the upper surface of the first substrate at regular intervals.

In the brazing and bonding of the spacer, heat treatment may be performed at a temperature ranging from 780° C. to 900° C.

The method may further include forming a bonding layer on one surface of the spacer and bonding the one surface of the spacer to the second substrate by the medium of the bonding layer.

In the forming of the bonding layer, solder or an Ag paste may be applied to one surface of the spacer to form the bonding layer.

Advantageous Effects of Invention

In accordance with a power module of the present disclosure, a peeling phenomenon of an electrode can be prevented by applying an active metal brazing (AMB) substrate as a first substrate and a second substrate.

In addition, in accordance with the present disclosure, a spacer is applied between the first and second substrates so that there is an effect being able to efficiently dissipate heat generated from a semiconductor chip mounted between the first and second substrates and to prevent bending deformation of the substrate due to the heat.

In addition, in accordance with the present disclosure, since a spacer made of an insulating material is integrated with the first substrate by brazing and bonding, bonding strength is improved so that strong bonding can be maintained against a vibration and the like.

In addition, in accordance with the present disclosure, since the spacer made of an insulating material insulates a semiconductor chip from peripheral components to prevent an electric shock, there is an effect of being able to improve performance of the power module.

BRIEF DESCRIPTION OF DRAWINGS

FIG. 1 is a perspective view illustrating a power module according to an embodiment of the present disclosure.

FIG. 2 is a cross-sectional view taken along line A-A in FIG. 1.

FIG. 3 is a cross-sectional view illustrating a state in which a spacer is bonded to a first substrate according to an embodiment of the present disclosure.

FIG. 4 is a cross-sectional view illustrating a state before the spacer is bonded to the first substrate according to an embodiment of the present disclosure.

FIG. 5 is a cross-sectional view illustrating a state in which a second substrate is bonded to the spacer according to an embodiment of the present disclosure.

FIG. 6 is a flowchart illustrating a method of manufacturing a power module according to an embodiment of the present disclosure.

DESCRIPTION OF EMBODIMENTS

Hereinafter, embodiments of the present disclosure will be described in detail with reference to the accompanying drawings.

FIG. 1 is a perspective view illustrating a power module according to an embodiment of the present disclosure.

As shown in FIG. 1, a power module 100 of the present disclosure is an electrical component in the form of a package formed by accommodating various components constituting the power module in a housing 110. The power module 100 may be a double-sided cooling power module having heat dissipation plates (or heat sinks) on both surfaces of an outer side of the housing 110 or a single-sided cooling power module having a heat dissipation plate (or a heat sink) on one surface of the housing 110.

Various components may be accommodated in a central empty space of the housing 110, and a first terminal 180 and a second terminal 190 may be disposed on both sides of the housing 110 to be connected to the various components. Here, the first terminal 180 and the second terminal 190 may be an input terminal and an output terminal of a power supply.

The various components accommodated in the housing 110 may include one or more substrates and one or more semiconductor chips and may be fixed to the housing 110 through fastening bolts 170.

FIG. 2 is a cross-sectional view taken along line A-A in FIG. 1.

FIG. 2 shows an excessive cross section of the line A-A of FIG. 1 and shows only components necessary for description while omitting some components.

Specifically, as shown in FIG. 2, the power module 100 may have a structure in which a first substrate 120, a second substrate 130, and a third substrate 160 are vertically stacked at regular intervals in an empty space in a central portion of the housing 100.

At least one semiconductor chip C may be mounted on an upper surface of the first substrate 120, and the second substrate 130 may be disposed above the first substrate 120. That is, the semiconductor chip C may be disposed between the first substrate 120 and the second substrate 130 which are vertically disposed.

The third substrate 160 may be disposed above the second substrate 130. The third substrate 160 may be a drive printed circuit board (PCB) and may be made of an FR4 material. The third substrate 160 may be fixed to the housing 110 through the fastening bolt 170.

In the case of a double-sided cooling power module, a heat dissipation plate may be attached to outer sides of the third substrate 160 and the first substrate 120. In the case of a one-sided cooling power module, a heat dissipation plate may be attached to the outer side of the first substrate 120.

The semiconductor chip C may be any one among a gallium nitride (GaN) chip, a metal oxide semiconductor field effect transistor (MOSFET), an insulated gate bipolar transistor (IGBT), a junction FET (JFET), a high electric mobility transistor (HEMT), a silicon (Si) chip, and a silicon carbide (SiC) chip, and the semiconductor chip C may be a GaN chip. The GaN chip is a semiconductor chip which serves as a high-power (300 A) switch and a high-speed (~1 MHz) switch. The GaN chip has an advantage of being more resistant to heat and reducing a size of a chip compared to the existing silicon-based semiconductor chip.

In addition, the GaN chip is a power semiconductor chip optimized for high performance and high efficiency due to its high electron mobility and high electron density which enable high-speed switching and miniaturization. In addition, the GaN chip stably operates even at high temperature and has a high output characteristic to enable high efficiency.

The semiconductor chip C is provided in the form of a flip chip bonded to a substrate by an adhesive layer such as solder or a silver paste. Since the semiconductor chip C is provided in the form of a flip chip on the substrate and thus a wire bonding is omitted, an inductance value may be as low as possible and heat dissipation performance may also be improved.

A power semiconductor chip generates high heat due to a high voltage. The heat generation causes an electrode formed on the substrate to peel off or causes the substrate to be bent. These peeling and bending phenomena may cause malfunction of the power module.

An active metal brazing (AMB) substrate may be applied to the first substrate 120 and the second substrate 130 so as to increase heat dissipation efficiency of heat generated from the semiconductor chip C. The AMB substrate is a ceramic substrate including a ceramic base 121 or 131 and a metal layer 122 or 132 brazed and bonded to at least one surface of the ceramic base 121 or 131.

The ceramic base 121 or 131 may be, for example, any one of alumina ($Al_2O_3$), AlN, SiN, and $Si_3N_4$. The metal layers 122 and 132 are metal foils brazed on the ceramic base 121 and 131 and may be formed of an electrode pattern for mounting the semiconductor chip C and an electrode pattern for mounting a driving device, respectively. For example, the metal layers 122 and 132 may be formed as electrode patterns in a region in which a semiconductor chip or a peripheral component is to be mounted or in a region including a spacer. The metal foil may be, for example, an aluminum foil or a copper foil. Preferably, a copper foil having a small thermal expansion coefficient is applied as the metal foil. As one example, the metal foil is sintered at a temperature ranging from 780° C. to 1100° C. on each of the ceramic bases 121 and 131 and brazed and bonded to each thereof.

The AMB substrates formed by brazing and bonding the metal layers 122 and 132 to the ceramic bases 121 and 131 solve a problem of a thermal impact due to a difference in thermal expansion coefficient and toughness resulting from a bonding of different materials so that reliability of the thermal impact can be increased. This may prevent the peeling of the electrode to contribute to improving the performance of the power module.

However, during high power control, when the ceramic substrate is placed at a high temperature that is greater than or equal to a predetermined temperature or a sudden temperature change occurs, the ceramic substrate may be separated from the metal layer (copper foil). Therefore, heat dissipation efficiency of the ceramic substrate may be degraded and an unstable operation of a device may be caused so that reliability may be degraded. Therefore, according to the power module of the present disclosure, a structure capable of stably dissipating heat to secure a stable operation of a device mounted on a ceramic substrate is applied.

That is, a structure in which the spacer 140 is disposed between the first substrate 120 and the second substrate 130 that are ceramic substrates is applied to the power module of the present disclosure. The spacer 140 is bonded to the upper surface of the first substrate 120 and defines a separation distance between the first substrate 120 and the second substrate 130. In this way, the spacer 140 may separate the first substrate 120 from the second substrate 130 to form a space, thereby increasing heat dissipation efficiency of heat generated from the semiconductor chip C.

Since the spacer 140 is provided relatively high compared to a height of the semiconductor chip C mounted on the upper surface of the first substrate 120, it is possible to prevent an electric impact such as a short circuit due to interference between the semiconductor chip C and the second substrate 130.

In addition, when the spacer 140 is bonded to the first substrate 120 and thus the second substrate 130 is disposed above the first substrate 120, the spacer 140 may be applied to check an alignment.

That is, when the semiconductor chip C is mounted on the first substrate 120, and then the second substrate 130 is disposed above the semiconductor chip C, the spacer 140 bonded to the first substrate 120 may be applied to check the alignment of the second substrate 130.

In addition, the spacer 140 may support the first substrate 120 and the second substrate 130 to contribute to preventing the first substrate 120 and the second substrate 130 from being bent. In addition, the spacer 140 may maintain a constant distance between the first substrate 120 and the second substrate 130 to protect the semiconductor chip C and insulate the semiconductor chip C from a periphery thereof to prevent a short circuit so that the spacer 140 can contribute to improving a lifetime and performance of the power module.

A plurality of spacers 140 may be bonded on an edge of the upper surface of the first substrate 120 at predetermined intervals. The intervals between the plurality of spacers 140 may be used as spaces for increasing heat dissipation efficiency.

The spacer 140 may be formed of a ceramic material for insulation between a chip mounted on the first substrate 120 and a chip and a component mounted on the second substrate 130. For example, the spacer may be formed of one selected from $Al_2O_3$, ZTA, $Si_3N_4$, and AlN, or a mixture of two or more thereof. $Al_2O_3$, ZTA, $Si_3N_4$, and AlN are insulating materials with excellent mechanical strength and excellent heat resistance.

When the spacer 140 is formed of Cu, a CuMo alloy, or the like, heat dissipation efficiency is excellent, but the spacer 140 is not suitable for a power module which requires heat dissipation or electrical insulation due to electrical conductivity. Therefore, the spacer 140 is preferably formed of a ceramic material.

FIG. 3 is a cross-sectional view illustrating a state in which the spacer is bonded to the first substrate according to an embodiment of the present disclosure, and FIG. 4 is a cross-sectional view illustrating a state before the spacer is bonded to the first substrate according to an embodiment of the present disclosure.

As shown in FIG. 3, the spacer 140 may be bonded to the metal layer 122 of the first substrate 120 to be integrated therewith. For example, the metal layer 122 is a Cu electrode.

A brazing bonding layer 150 bonds the spacer 140 to the first substrate 120. The brazing bonding layer 150 is a bonding layer for integrating the first substrate 120 with the spacer 140 through brazing. The brazing bonding layer 150 may prevent the spacer 140 from being separated from the first substrate 120.

As shown in FIG. 4, the brazing bonding layer 150 includes an AgCu layer 152. In addition, the brazing bonding layer 150 may further include a Ti layer 151. The brazing bonding layer 150 may be formed with a thickness which maintains bonding strength between the first substrate 120 and the spacer 140 to minimize bonding stress. For example, the brazing bonding layer 150 may have a minimum thickness ranging from 0.005 mm to 0.08 mm and may be uniformly bonded to minimize bonding stress.

Since the AgCu layer 152 has high thermal conductivity, heat generated from the semiconductor chip C may be smoothly transferred to the first substrate 120. In addition, since the AgCu layer 152 includes Cu, which is a material of the metal layer 122 of the first substrate 120, a thermal expansion coefficient of the AgCu layer 152 is similar to that of the metal layer 122. When a difference between the thermal expansion coefficients of the brazing bonding layer 150 and the metal layer 122 is large, thermal stress may be generated during a brazing process performed at a high temperature ranging from 780° C. to 900° C. so that damage such as torsion may occur. Accordingly, the brazing bonding layer 150 may be formed to include the AgCu layer 152 having a thermal expansion coefficient similar to that of the metal layer 122 of the first substrate 120. The spacer 140 may be uniformly bonded to the metal layer 122 of the first substrate 120 due to the AgCu layer 152 without torsion.

Meanwhile, the brazing bonding layer 150 including only the AgCu layer 152 may increase bonding strength when applied to metal-to-metal brazing bonding. However, when applied to metal-to-ceramic brazing bonding, the bonding strength may be weak with only the AgCu layer 152. Accordingly, in order to increase the bonding strength between the metal and the ceramic, the brazing bonding layer 150 may further include the Ti layer 151. The Ti layer 151 may serve as a seed layer to increase bonding strength when the spacer 140 made of an insulating material is bonded to the metal layer 122 of the first substrate 120.

Since an active metal such as Ti contained in the Ti layer 151 reacts with the ceramic during brazing to form oxide, nitride, or carbide at an interface, bonding strength may be increased. Here, Zr may be used as a brazing active metal instead of Ti, but since Ti has excellent bonding strength with the AgCu layer, the use of Ti is preferable.

The Ti layer 151 and the AgCu layer 152 may be formed on the first substrate 120 or the spacer 140. In the embodiment, the Ti layer 151 and the AgCu layer 152 are formed on the spacer 140. For example, the Ti layer 151 may be formed below the spacer 140 and the AgCu layer 152 may be formed on the Ti layer 151. Ag and Cu may be included in the AgCu layer 152 at a ratio ranging from 6:4 or 7:3. The ratio of Ag and Cu may determine a brazing temperature.

Meanwhile, referring to FIG. 5, after a lower end portion of the spacer 140 is brazed and bonded to the first substrate 120, an upper end portion thereof may be bonded to a metal layer 132 of the second substrate 130 by a bonding layer b. The bonding layer b may be made of solder or an Ag paste. Like the lower end portion, when the upper end portion of the spacer 140 is brazed and bonded to the second substrate 130, since a total of two brazing processes should be performed, bending may occur in the first substrate 120 and may affect the semiconductor chip C. Therefore, the upper end portion of the spacer 140 is preferably bonded to the second substrate 130 with solder or an Ag paste.

The solder may be formed of a SnPb-based, SnAg-based, SnAgCu-based, or Cu-based solder paste having high bonding strength and excellent high-temperature reliability.

The Ag paste has more excellent high-temperature reliability and high thermal conductivity than the solder. The Ag paste preferably contains 90 to 99% by weight of an Ag powder and 1 to 10% by weight of a binder so as to increase thermal conductivity. The Ag powder is preferably nanoparticles. The Ag powder of nanoparticles has high junction density and high thermal conductivity due to its high surface area.

The bonding layer b may be formed on one surface of the spacer 140 by a method such as paste printing or thin film foil attachment, and the one surface of the spacer 140 may be bonded to a lower surface of the second substrate 130 by the medium of the bonding layer b. When the bonding layer b is solder, bonding may be performed by heating and pressing at a temperature of about 200° C., and when the bonding layer b is Ag paste, bonding may be performed by heating and pressing at a temperature of about 270° C.

FIG. 6 is a flowchart illustrating a method of manufacturing a power module according to an embodiment of the present disclosure.

As shown in FIG. 6, the method of manufacturing a power module according to the present disclosure includes preparing the first substrate 120 (S10), preparing the spacer 140 (S20), forming the brazing bonding layer 150 on the first substrate 120 or the spacer 140 (S30), arranging the spacer 140 on the first substrate 120 to interpose the brazing bonding layer 150 between the first substrate 120 and the spacer 140 (S40), and performing heat treatment on the brazing bonding layer 150 to braze and bond the spacer 140 to the first substrate 120 (S50).

In the preparing of the first substrate (S10), a ceramic substrate in which the metal layer 122 is bonded to at least one surface of the ceramic base 121 is prepared. For example, the ceramic substrate is an AMB substrate in which the metal layer 122 is a Cu electrode.

In the preparing of the spacer (S20), the spacer 140 formed of a ceramic material may be prepared. As one example, in the preparing of the spacer (S20), the spacer 140 formed of one selected from $Al_2O_3$, ZTA, $Si_3N_4$, and AlN, or a mixture of two or more thereof may be prepared.

The forming of the brazing bonding layer 150 (S30) may include forming the AgCu layer 152 on the first substrate 120 or the spacer 140 by any one of paste printing, foil attachment, and filler attachment. Here, the foil attachment is performed by forming a brazing filler including the AgCu layer 152 on a release film in the form of a ribbon and attaching the ribbon to the spacer 140. The AgCu layer 152 may be formed in the form of including an Ag layer, a Cu layer formed on an upper surface of the Ag layer, and an Ag layer formed on an upper surface of the Cu layer.

The forming of the brazing bonding layer 150 (S30) may further include forming the Ti layer 151 before or after the forming of the AgCu layer 152. When the brazing bonding layer 150 is formed on the spacer 140, the Ti layer 151 may be formed below the spacer 140 and the AgCu layer 152 may be formed on the Ti layer 151. When the brazing bonding layer 150 is formed on the first substrate 120, the AgCu layer 152 may be formed on the first substrate 120, and the Ti layer 151 may be formed on the AgCu layer 152. In the present embodiment, the brazing bonding layer 150 is formed on the spacer 140. Ag and Cu are included in the AgCu layer 152 at a ratio ranging from 6:4 or 7:3. The ratio of Ag and Cu is derived from a composition ratio at a eutectic point where two liquidus lines intersect in a metal binary phase diagram.

In the arranging of the spacer 140 on the first substrate 120 (S40), a plurality of spacers 140 are disposed around an edge of the upper surface of the first substrate 120 at predetermined intervals.

In the brazing and bonding (S50), heat treatment may be performed at a temperature ranging from 780° C. to 900° C. When the heat treatment for brazing is performed at a temperature ranging from 780° C. to 900° C., since the brazing bonding layer 150 is melted and the first substrate 120 is not melted, bonding is possible while preventing damage due to heat. The heat treatment may be performed in a vacuum or in an inert atmosphere. The brazing and bonding may be performed once or twice.

After the brazing, the spacer 140 is integrated with the metal layer 122 of the first substrate 120. A thickness of the brazing bonding layer 150 ranges from 0.005 mm to 0.08 mm, and thus the thickness is small enough not to affect a height of the spacer 140 and bonding strength is high.

Meanwhile, the method of manufacturing a power module according to the present disclosure may further include forming the bonding layer b on one surface of the spacer 140, and bonding the one surface of the spacer 140 to the second substrate 130 by the medium of the bonding layer b.

Here, in the forming of the bonding layer b, the bonding layer b may be formed by applying solder or an Ag paste to one surface of the spacer 140. Here, the solder may be made of a SnPb-based, SnAg-based, SnAgCu-based, or Cu-based solder paste, and the Ag paste may be made by including 90 to 99% by weight of an Ag powder and 1 to 10% by weight of a binder.

Meanwhile, in the bonding of the one surface of the spacer 140 to the second substrate 130, when the bonding layer b is the solder, bonding may be performed by heating and pressing at a temperature of about 200° C., and when the bonding layer b is the Ag paste, bonding may be performed by heating and pressing at a temperature of about 270° C.

In this way, since upper and lower end portions of the spacer 140 are bonded to the first substrate 120 and the second substrate 130, the second substrate 130 may be disposed above the first substrate 120. Here, although the brazing and bonding between the second substrate 130 and the spacer 140 is possible, since the brazing and bonding may affect the semiconductor chip C mounted on the upper surface of the first substrate 120, bonding with the solder or the Ag paste is preferable.

Thereafter, the third substrate 160 may be installed above the second substrate 130. The third substrate 160 may be fixed to the housing 110 through the fastening bolt 170. In addition, the second substrate 130 and the third substrate 160 may be connected between components through a plurality of terminal pins (not shown).

Experiment

In order to confirm whether the bonding strength between the first substrate 120 and the spacer 140 was increased by the brazing and bonding used in the method of manufacturing a power module according to the embodiments of the present disclosure, an experiment was conducted. In this case, as in the embodiments of the present disclosure, peel strength was measured when the spacer 140 was brazed and bonded to the metal layer 122 of the first substrate 120, and as Comparative Example, when the spacer 140 was soldered and bonded to the metal layer 122 of the first substrate 120, peel strength was measured.

As a result of the measurement, it was confirmed that the peel strength during the soldering and bonding was 4N, and the peel strength during the brazing and bonding was 21N and bonding strength was increased by as much as about seven times.

As described above, in the power module according to the embodiments of the present disclosure, the AMB substrate is applied as the first substrate 120 and the second substrate 130 so that a peeling phenomenon of the electrode is prevented.

The spacer 140 may increase heat dissipation efficiency by securing a space between the first substrate 120 and the second substrate 130 and insulate the chip mounted on the first substrate 120 from the chip or components mounted on the second substrate 130.

In addition, the spacer 140 may be applied between the first substrate 120 and the second substrate 130 to efficiently dissipate the heat generated from the semiconductor chip C and prevent the first substrate 120 and the second substrate 130 from being bent due to the heat.

In addition, the spacer 140 is brazed and bonded to the first substrate 120 so that bonding strength can be improved. Accordingly, the spacer 140 may maintain strong bonding against a vibration of the power module 100 so that performance of the power module 100 can be improved.

Meanwhile, since the brazing bonding layer 150 includes the AgCu layer 152, the bonding strength with the metal layer 122 formed of Cu is excellent. Accordingly, the brazing bonding layer 150 may be formed to have a thickness minimizing bonding stress and strongly bond the spacer 140 to the metal layer 122 of the first substrate 120.

In addition, since the AgCu layer 152 has a thermal expansion coefficient similar to that of Cu constituting the metal layer 122, it is possible to uniformly bond the spacer 140 to the metal layer 122 of the first substrate 120 without distortion even during the brazing process performed at a high temperature ranging from 780° C. to 900° C.

Although the above-described present disclosure has been described as an example in which a brazed bonding structure between the substrate and the spacer which were applied to the power module, it is applicable to any bonding structure for increasing bonding strength between a metal and a ceramic.

In the present disclosure, exemplary embodiments are disclosed in the drawings and in the specification. Here, although specific terms have been used, they are only used for the purpose of describing the present disclosure and are not used to limit the meaning or scope of the present disclosure in the appended claims. Therefore, those skilled in the art will appreciate that various modifications and equivalent other embodiments can be derived without departing from the scope of the present disclosure. Therefore, the true technical scope of the present disclosure should be defined by the technical spirit of the appended claims.

The invention claimed is:

1. A method of manufacturing a power module, comprising:

preparing a first substrate comprising a ceramic base and an electrode pattern brazed to at least a first surface of the ceramic base, and having an upper surface on which at least one semiconductor chip is mounted;

preparing a spacer formed of an electrically insulating ceramic material;

forming a brazing bonding layer on the first substrate or the spacer, wherein the forming of the brazing bonding layer includes forming, on the first substrate or the spacer, a brazing bonding layer having a two-layer structure in which an AgCu layer including Ag and Cu and a Ti layer including Ti are stacked in direct contact with each other, the AgCu layer being disposed to be in contact with the electrode pattern disposed on the upper surface of the first substrate, and the Ti layer being disposed to be in contact with a lower surface of the spacer;

arranging the spacer on the electrode pattern of the first substrate to interpose the brazing bonding layer between the electrode pattern of the first substrate and a lower surface of the spacer;

performing heat treatment on the brazing bonding layer and brazing and bonding the lower surface of the spacer to the electrode pattern of the first substrate;

preparing a second substrate comprising a ceramic base and an electrode pattern brazed to at least a first surface of the ceramic base;

forming a bonding layer on an upper surface of the spacer;

arranging the second substrate on the spacer to interpose the bonding layer between the electrode pattern of the second substrate and the upper surface of the spacer; and bonding the upper surface of the spacer to the electrode pattern of the second substrate by medium of the bonding layer;

wherein, in the arranging of the spacer on the electrode pattern of the first substrate, a plurality of spacers are disposed around an edge of the upper surface of the first substrate at regular intervals such that the plurality of spacers surround the semiconductor chip mounted on the upper surface of the first substrate.

2. The method of claim 1, wherein, in the preparing of the spacer, the spacer formed of one selected from Al2O3, ZTA, Si3N4, and AlN or a mixture of two or more thereof is prepared.

3. The method of claim 1, wherein the forming of the brazing bonding layer further includes forming the AgCu layer on the first substrate or the spacer by any one among paste printing, foil attachment, and filler attachment.

4. The method of claim 3, wherein the forming of the brazing bonding layer further includes forming the Ti layer before or after the forming of the AgCu layer.

5. The method of claim 1, wherein, in the brazing and bonding of the spacer to the first substrate, heat treatment is performed at a temperature ranging from 780° C. to 900° C.

6. The method of claim 1, wherein, in the forming the bonding layer, solder or an Ag paste is applied to one surface of the spacer to form the bonding layer.

* * * * *